United States Patent [19]

Matsumoto

[11] Patent Number: 5,920,206
[45] Date of Patent: Jul. 6, 1999

[54] DIFFERENTIAL ECL

[75] Inventor: Koji Matsumoto, Tokyo, Japan

[73] Assignee: NEC Corporation, Tokyo, Japan

[21] Appl. No.: 08/824,615

[22] Filed: Mar. 27, 1997

[30] Foreign Application Priority Data

Mar. 28, 1996 [JP] Japan ..................... 8-074512

[51] Int. Cl.$^6$ ............................................. H03K 19/086
[52] U.S. Cl. ........................ 326/126; 326/130; 327/325
[58] Field of Search ................. 326/9, 14, 126, 326/127, 130; 327/65, 96, 325, 563

[56] References Cited

FOREIGN PATENT DOCUMENTS

| 64-10727 | 1/1989 | Japan | 326/126 |
| 4-170222 | 6/1992 | Japan | 326/126 |
| 6-232725 | 8/1994 | Japan | 326/126 |

*Primary Examiner*—Jon Santamauro
*Assistant Examiner*—Don Phu Le
*Attorney, Agent, or Firm*—Foley & Lardner

[57] ABSTRACT

In order to provide a differential ECL wherein the malfunction resulting from the constant current source being cut off from the power supply is prevented and wherein the output logic is determined on one side even when input terminals thereof are left open, a differential ECL of the invention comprises means for clamping a potential difference that is smaller than a predetermined value between the collector and the emitter of one of the differential transistors and enabling a current to flow through the constant current source.

13 Claims, 4 Drawing Sheets

DIFFERENTIAL ECL

BACKGROUND OF THE INVENTION

The present invention relates to a differential ECL (Emitter Coupled Logic circuit), and more particularly to that provided with a clamp circuit for preventing malfunction caused when its input terminals are left open.

By way of example, a prior art of the differential ECL having a clamp circuit is described with reference to a circuit diagram of FIG. 4 which illustrates a differential ECL disclosed in a Japanese patent application laid open as a Provisional Publication No. 10727/'89.

The differential ECL of FIG. 4 has a differential circuit 1 comprising;

a constant current source Ics connected between a node N and a negative supply VEE, first and second resistors R11 and R12, each having an end connected to a positive supply GND, and first and second transistors Q11 and Q12, each having a collector connected to the other ends of the first and the second resistors R11 and R12, an emitter connected to the node N, and a base supplied with one of complementary input signals IN and $\overline{\text{IN}}$, and a clamp circuit 40 comprising a serial connection of three diodes D21, D22 and D23 provided between the node N and the positive supply GND.

FIG. 5 is a graphic chart illustrating potential VE of the node N changing in accordance with the complementary input signals IN and $\overline{\text{IN}}$.

When the bases of the first and the second transistors Q11 and Q12 are supplied with the complementary input signals IN and $\overline{\text{IN}}$ of ordinary potential level for the ECL, the clamp circuit 40 remains OFF with no current flowing through the three diodes D21, D22 and D23, as follows.

HIGH and LOW level of the complimentary input signals being −0.9V, −1.7V, respectively, and forward biases of the diodes or transistors being 0.8V, potential VE of the node N is represented as VE=min(IN, $\overline{\text{IN}}$)−0.8V, min(IN, $\overline{\text{IN}}$) denoting lower potential of the complementary input signals IN and $\overline{\text{IN}}$, which remains over −2.4V, and potential difference between the node N and the positive supply GND does not become more than three times of the forward bias.

When both the bases become open with no base-current supplied, the first and the second transistors Q11 and Q12 become OFF and the potential VE of the node N falls until clamped by the clamp circuit 40, the three diodes D21, D22 and D23 becoming ON. In this case, output signals OUT and $\overline{\text{OUT}}$ from collectors of the first and the second transistors Q11 and Q12 become both at HIGH level, current of the constant current source Ics flowing through the clamp circuit 40.

Thus, the malfunction resulting from the constant current source Ics being cut off from the power supply is prevented in the prior art of FIG. 4. However, there still remains a disadvantage in that output logic to be supplied to next differential logic circuit is undetermined when input terminals of the differential ECL of FIG. 4 are left open, because output signals to be complementary become both at HIGH level with no current flowing through neither of the first and the second resistors R11 and R12.

SUMMARY OF THE INVENTION

Therefore, a primary object of the present invention is to provide differential ECL composed of a BiMOS logic circuit without the above disadvantage.

In order to achieve the object, a differential ECL of the invention having a constant current source connected between a node and a first power supply, first and second resistors each having an end connected to second power supply, and first and a second transistors each having a collector connected to the other end of the first and the second resistors, an emitter connected to the node, and a base supplied with complementary input signals, and means for clamping potential difference between the collector and the emitter of one of the first and the second transistors smaller than a predetermined value and enabling a current to flow through the constant current source.

Therefore, output logic of the differential ECL is determined in one side in the invention even when input terminals thereof are left open, preventing the malfunction resulting from the constant current source being cut off from the power supply, at the same time.

BRIEF DESCRIPTION OF THE DRAWINGS

The foregoing, further objects, features, and advantages of this invention will become apparent from a consideration of the following description, the appended claims, and the accompanying drawings wherein the same numerals indicate the same or the corresponding parts.

DETAILED DESCRIPTION OF THE PREFERRED EMBODIMENTS

Now, embodiments of the present invention will be described in connection with the drawings.

Figure 1:
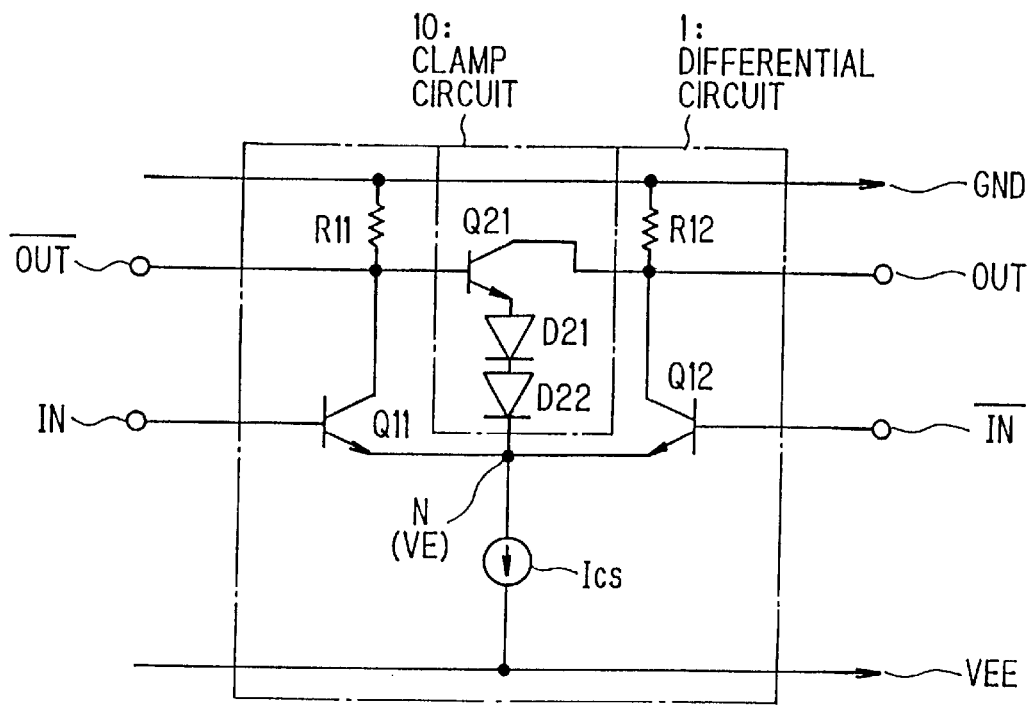
FIG. 1 is a circuit diagram illustrating a differential ECL according to an embodiment of the invention.
Figure 4:
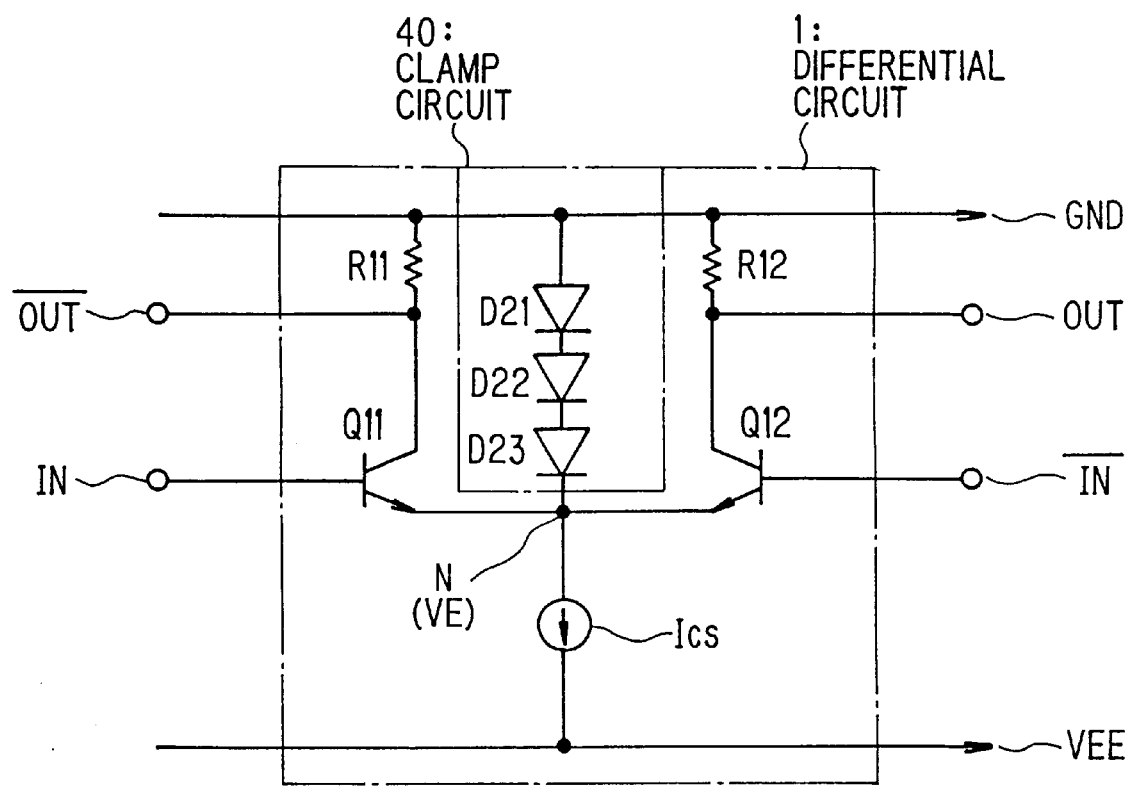
FIG. 4 is a circuit diagram illustrating a differential ECL of a prior art.

FIG. 1 is a circuit diagram illustrating a differential ECL according to an embodiment of the invention, having the same differential circuit 1 with the differential ECL of FIG. 4 and a clamp circuit 10 comprising:

a third transistor Q21, a base thereof connected to a collector (outputting the output signal $\overline{\text{OUT}}$) of the first transistor Q11 and a collector thereof connected to a collector (outputting the output signal OUT) of the second transistor Q12, and a serial connection of two diodes D21 and D22 connected between an emitter of the third transistor Q21 and the node N.

Figure 5:
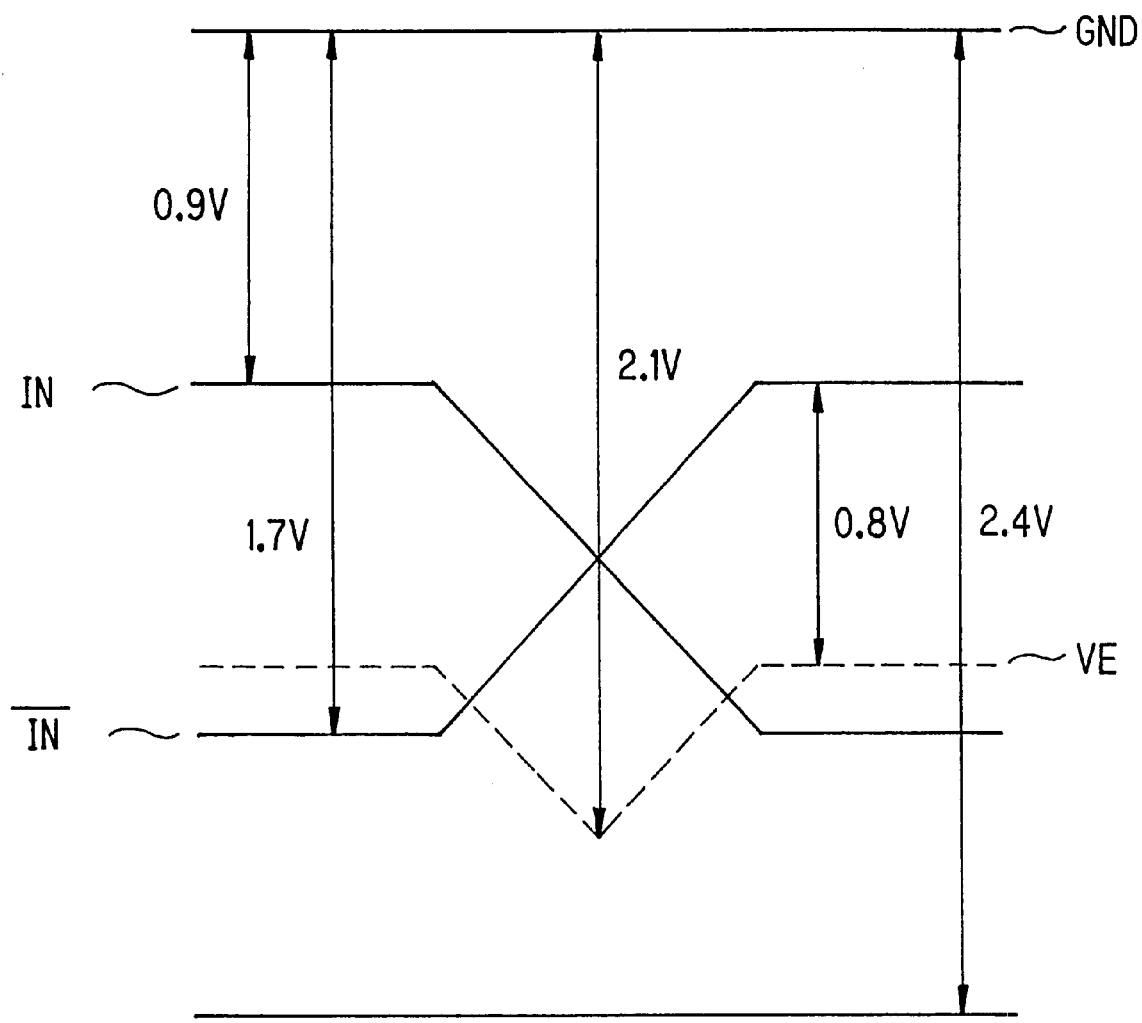
FIG. 5 is a graphic chart illustrating operation of the differential ECL of FIG. 4.

Referring to FIG. 1 and FIG. 5, operation of the embodiment will be described.

When bases of the first and the second transistors Q11 and Q12 are supplied with the complimentary input signals IN and $\overline{\text{IN}}$ of ordinary potential level for the ECL, the clamp circuit 10 remains OFF with no current flowing through base-emitter of the third transistor Q21 and the two diodes D21 and D22, since potential difference between the collector of the first transistor Q11 and the node N does not become more than 2.4V in the same way as described in connection with the prior art of FIG. 4, supposing signal levels and forward biases are the same.

When both of the bases become open with no base-current supplied, the first and the second transistors Q11 and Q12 become OFF and the potential VE of the node N falls until clamped by the clamp circuit 10, the third transistor Q21 and the two diodes D21 and D22 becoming ON. In this case, the output signal OUT becomes at LOW level and the output signal $\overline{\text{OUT}}$ becomes at HIGH level, current of the constant current source Ics flowing through the second resistor R12 and the clamp circuit 10.

Thus, output logic is determined in one side in the differential ECL of the embodiment even when input terminals thereof are left open.

Figure 2:
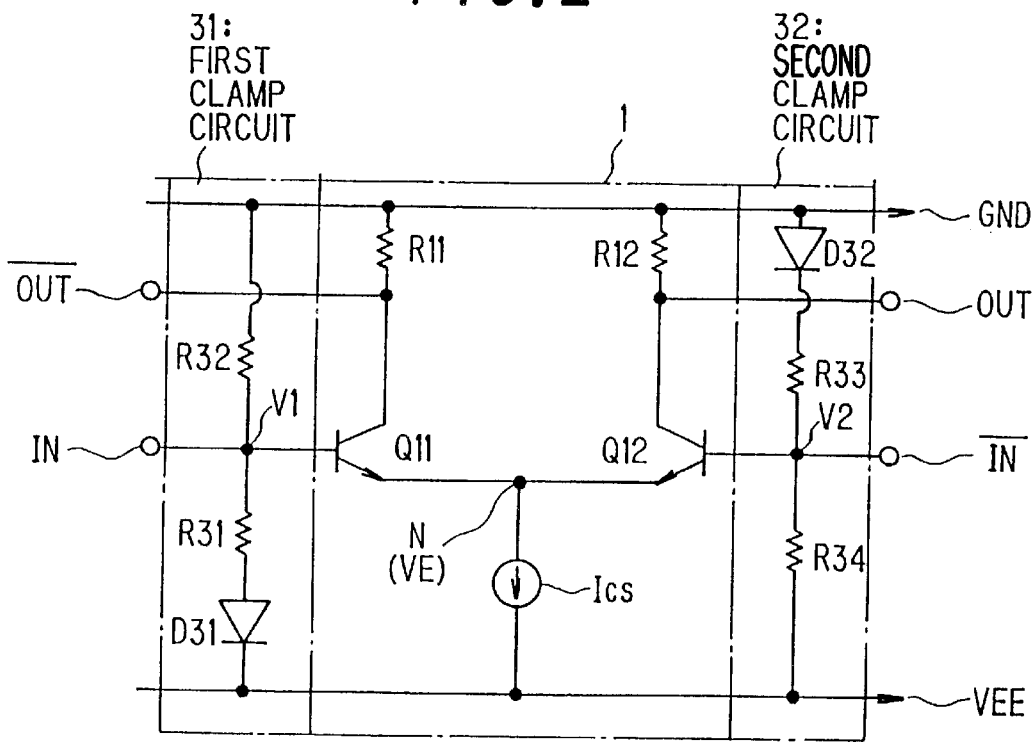
FIG. 2 is a circuit diagram illustrating a differential ECL according to another embodiment of the invention.

FIG. 2 is a circuit diagram illustrating a differential ECL according to another embodiment of the invention, which is provided with:

a first clamp circuit 31 comprising a serial connection of a first diode D31 and a third resistor R31 connected between the base of the first transistor Q11 and the negative supply VEE and a fourth resistor R32 connected between the base of the first transistor Q11 and the positive supply GND, and a second clamp circuit 32 comprising a serial connection of a second diode D32 and a fifth resistor R33 connected between the base of the second transistor Q12 and the positive supply GND and a sixth resistor R34 connected between the base of the second transistor Q12 and the negative supply VEE.

Figure 3:
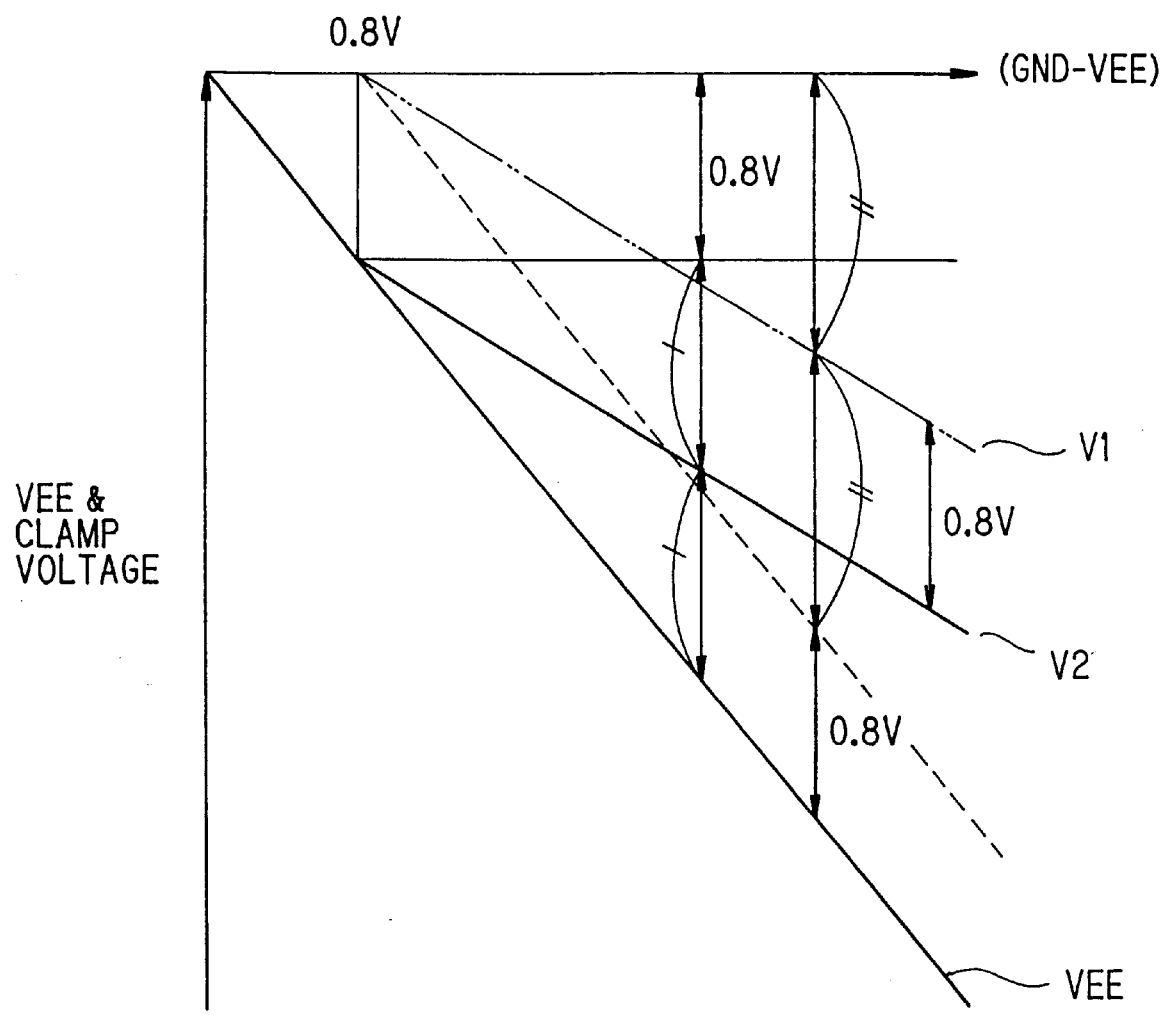
FIG. 3 is a graphic chart illustrating operation of the differential ECL of FIG. 2 when input terminals thereof are left open.

FIG. 3 is a graphic chart illustrating operation of the differential ECL of FIG. 2 when input terminals thereof are left open.

By preparing the resistance of the third to the sixth resistors R31 to R34 to be sufficiently high, the differential ECL of FIG. 2 operates the same as that of FIG. 1 when bases of the first and the second transistor Q11 and Q12 are supplied with ordinary complementary input signals IN and $\overline{\text{IN}}$.

Referring to FIG. 3, current flows through the first and the second clamp circuits 31 and 32 when potential difference between the positive and the negative supply GND and VEE is more than Vf, the forward bias of the diodes, and clamps potentials V1 and V2 of the bases of the first and the second transistors Q11 and Q12, in case they are left open.

In this case, the potentials V1 and V2 are represented as follows.

$$V1 = -(GND - VEE - Vf) \times \{R32/(R31+R32)\}$$

$$V2 = -Vf - (GND - VEE - Vf) \times \{R33/(R33+R34)\}$$

Therefore, by preparing resistance of the third to the sixth resistors R31 to R34 to be the same, potential difference between two input terminals of the differential ECL of the embodiment can be maintained as Vf, namely 0.8V, outputting output signals OUT and $\overline{\text{OUT}}$ at HIGH and LOW levels, respectively.

What is claimed is:

1. A differential ECL comprising:
   a constant current source connected between a node and a first power supply;
   first and second resistors each having an end connected to a second power supply;
   first and second transistors each having a collector connected to the other ends of the first and the second resistors, an emitter connected to the node, and a base supplied with one of complementary input signals, and
   means for clamping a potential difference between the collector and the emitter of only one of the first and the second transistors thereby enabling a current to flow through the constant current source.

2. A differential ECL recited in claim 1, wherein said means for clamping comprises:
   a third transistor, a base of said third transistor connected to said collector of the first transistor and a collector of said third transistor connected to said collector of the second transistor, and
   a diode circuit connected between an emitter of said third transistor and the node.

3. A differential ECL recited in claim 2, wherein the diode circuit includes at least two serially connected diodes.

4. A differential ECL comprising:
   a node;
   a first transistor having a first electrode connected to a first output terminal, a second electrode connected to said node and a first control electrode connected to a first input terminal;
   a second transistor having a third electrode connected to a second output terminal, a fourth electrode coupled to said node and a second control electrode connected to a second input terminal; and
   a clamping circuit clamping the voltage level of said node and fixing said first output terminal and said second output terminal at two voltage levels different from each other when said first input terminal and said second input terminal are left open.

5. The differential ECL as claimed in claim 4, wherein said clamping circuit comprises:
   a third transistor having a fifth electrode connected to said second output terminal, a third control electrode connected to said first output terminal and a sixth electrode; and
   a voltage step down circuit connected between said sixth electrode and said node.

6. The differential ECL as claimed in claim 4, wherein said clamping circuit comprises a first circuit fixing said first input terminal into a first level, and a second circuit fixing said second input terminal into a second level different from said first level, when said first input terminal and said second input terminal are left open.

7. A method of preventing malfunction of a differential ECL, having first and second transistors and a constant current source connected to a power supply, when the constant current source is cut off from the power supply as a result of the input terminals of the transistors being left open, said method comprising the step of clamping a potential difference that is smaller than a predetermined value between the collector and the emitter of only one of the first and second transistors to enable a current to flow through the constant current source.

8. A clamp circuit for a differential ECL having first and second transistors, a current source, one end of which is connected to emitters of the first and second transistors and the other end of which is connected to a first power supply, first and second resistors connected between a second power supply and collectors of the first and second transistors, said clamp circuit comprising:
   a third transistor having a base connected between the first resistor and the collector of the first transistor, a collector connected between the second resistor and the collector of the second transistor, and an emitter connected to emitters of the first and second transistors through a diode circuit.

9. The clamp circuit as claimed in claim 8, wherein the diode circuit includes at least two serially connected diodes.

10. A differential ECL comprising:
    first and second transistors;

a current source connected between emitters of the first and second transistors and a first power supply;

first and second resistors connected between the first and second transistors and a second power supply;

a first clamp circuit fixing a voltage level of a base of the first transistor at a first voltage level; and a second clamp circuit fixing a base of said second transistor at a second voltage level different from the first voltage level.

11. The differential ECL as claimed in claim 10, wherein the first clamp circuit includes a third resistor and a first diode connected between the base of the first transistor and the first power supply and a fourth resistor connected between the base of the first transistor and the second power supply.

12. The differential ECL as claimed in claim 11, wherein the second clamp circuit includes a fifth resistor connected between the base of the second transistor and the first power supply and a second diode and a sixth resistor connected between the base of the second transistor and the second power supply.

13. The differential ECL as claimed in claim 10, wherein the second clamp circuit includes a fifth resistor connected between the base of the second transistor and the first power supply and a second diode and a sixth resistor connected between the base of the second transistor and the second power supply.

* * * * *